United States Patent
Gross et al.

(10) Patent No.: US 6,959,993 B2
(45) Date of Patent: Nov. 1, 2005

(54) SOLAR CONCENTRATOR ARRAY WITH INDIVIDUALLY ADJUSTABLE ELEMENTS

(75) Inventors: William Gross, Pasadena, CA (US); Gregg Luconi, Pasadena, CA (US); Denes Zsolnay, Rolling Hills Estates, CA (US)

(73) Assignee: Energy Innovations, Inc., Pasadena, CA (US)

( * ) Notice: Subject to any disclaimer, the term of this patent is extended or adjusted under 35 U.S.C. 154(b) by 0 days.

(21) Appl. No.: 10/888,079

(22) Filed: Jul. 9, 2004

(65) Prior Publication Data

US 2005/0034751 A1 Feb. 17, 2005

Related U.S. Application Data

(60) Provisional application No. 60/486,879, filed on Jul. 10, 2003.

(51) Int. Cl.⁷ ............... G02B 7/182; F24J 2/08; F24J 2/10; F24J 2/16
(52) U.S. Cl. ............ 359/853; 359/851; 359/900; 126/684; 126/688; 126/698
(58) Field of Search ............... 136/206, 246; 126/683, 684, 685, 686, 687, 688, 689, 690, 126/691, 692, 693, 694, 695, 696, 698, 699, 126/700; 359/851, 852, 853, 855, 846, 849, 359/877, 865, 900

(56) References Cited

U.S. PATENT DOCUMENTS

| | | | |
|---|---|---|---|
| 3,009,391 A * | 11/1961 | Zagieboylo et al. ........ 359/853 |
| 4,035,065 A | 7/1977 | Fletcher et al. |
| 4,056,313 A | 11/1977 | Arbogast |
| 4,098,264 A | 7/1978 | Brokaw |
| 4,103,673 A | 8/1978 | Woodworth et al. |
| 4,149,902 A | 4/1979 | Mauer et al. |
| 4,168,696 A | 9/1979 | Kelly |
| 4,172,443 A | 10/1979 | Sommer |
| 4,191,164 A | 3/1980 | Kelly |
| 4,209,222 A * | 6/1980 | Posnansky ............... 359/359 |
| 4,227,939 A | 10/1980 | Zewail et al. |
| 4,256,088 A | 3/1981 | Vindum |
| 4,267,824 A | 5/1981 | O'Halloran |
| 4,295,463 A | 10/1981 | Citron |
| 4,333,446 A | 6/1982 | Smyth |
| 4,408,595 A | 10/1983 | Broyles et al. |
| 4,424,802 A | 1/1984 | Winders |
| 4,491,388 A | 1/1985 | Wood |

(Continued)

*Primary Examiner*—John Juba, Jr.
(74) *Attorney, Agent, or Firm*—Knobbe, Martens, Olson &Bea; Andrew S. Naglestad; Michael B. Brooks

(57) ABSTRACT

A tracking heliostat array comprises a plurality of optical elements. The tracking heliostat array further comprises a frame separated from the optical elements. Each of the optical elements has an orientation with respect to the frame. The tracking heliostat array further comprises a plurality of supports coupled to at least one of the optical elements. The tracking heliostat array further comprises a turnbuckle coupled to at least one of the supports and to the frame. Rotation of the turnbuckle causes the corresponding support to be displaced relative to the frame. The orientation of the optical element relative to the frame is adjustable. The tracking heliostat array further comprises a traveling actuator configured to rotate at least one of the turnbuckles. The tracking heliostat array further comprises a positioning mechanism supporting the traveling actuator. The positioning mechanism is configured to move the traveling actuator from a first selected turnbuckle to a second selected turnbuckle.

59 Claims, 8 Drawing Sheets

U.S. PATENT DOCUMENTS

| | | | |
|---|---|---|---|
| 4,682,865 A * | 7/1987 | Rogers et al. | 359/846 |
| 4,800,868 A | 1/1989 | Appeldorn et al. | |
| 4,968,355 A * | 11/1990 | Johnson | 136/246 |
| 5,203,318 A | 4/1993 | Chauvet | |
| 5,255,666 A | 10/1993 | Curchod | |
| 5,347,986 A | 9/1994 | Cordy | |
| 5,395,070 A | 3/1995 | Stirbl et al. | |
| 5,529,054 A | 6/1996 | Shoen | |
| 5,542,409 A | 8/1996 | Sampayo | |
| 5,640,950 A | 6/1997 | Cordy, Jr. | |
| 5,758,938 A | 6/1998 | Osterwisch | |
| 5,787,878 A | 8/1998 | Ratliff, Jr. | |
| 5,862,799 A | 1/1999 | Yogev et al. | |
| 5,958,761 A | 9/1999 | Yogev et al. | |
| 5,977,478 A | 11/1999 | Hibino | |
| 6,020,554 A | 2/2000 | Kaminar et al. | |
| 6,080,927 A | 6/2000 | Johnson | |
| 6,134,784 A | 10/2000 | Carrie et al. | |
| 6,276,359 B1 | 8/2001 | Frazier | |
| 6,442,937 B1 | 9/2002 | Stone et al. | |
| 6,688,303 B2 | 2/2004 | Davenport et al. | |
| 6,700,055 B2 | 3/2004 | Barone | |
| 6,704,607 B2 | 3/2004 | Stone et al. | |

* cited by examiner

SOLAR CONCENTRATOR ARRAY WITH INDIVIDUALLY ADJUSTABLE ELEMENTS

PRIORITY APPLICATION

This application claims the benefit of U.S. Provisional Application 60/486,879, filed 10 Jul. 2003, the entire disclosure of which is hereby incorporated by reference herein.

FIELD OF THE INVENTION

The present invention relates generally to solar concentrators, and more specifically to an array of solar concentrators capable of tracking movement of the sun.

BACKGROUND OF THE INVENTION

Many solar concentrators comprise a single optical element, such as a single lens, mirror, or reflector. Examples of such concentrators include dish and trough concentrators. Other solar concentrators comprise an array of optical elements that are individually adjustable to track the position of the sun in the sky. One type of arrayed concentrator is the "heliostat array". In a heliostat array, a field of reflective optical elements concentrates solar energy on a collector having dimensions that are small compared to the dimensions of the array. The orientation of the optical elements in a heliostat array can be individually adjustable, thereby allowing the focal point of the array to remain on the collector over the course of a day and during different seasons. Such an arrangement is often referred to as a "tracking" heliostat array.

In a conventional tracking heliostat array, configuring each optical element to be individually movable typically requires a large amount of expensive motorized equipment. For example, in one conventional configuration, two motors are used to adjust the orientation of each element in the tracking heliostat array. Thus, using this configuration, a tracking heliostat array comprising a 10×10 array of mirrors uses 200 motors to adjust the orientation of the mirrors. In addition to causing the array to be undesirably expensive, this large amount of motorized equipment results in an array that is relatively heavy, which is particularly disadvantageous for applications where weight is a significant factor, such as for rooftop mounted applications.

SUMMARY OF THE INVENTION

Based on the foregoing, an improved tracking heliostat array has been developed. In an example embodiment, a relatively small number of motors can be used to adjust the orientation of a relatively greater number of individual optical elements in the array. By using a single group of motors to adjust the orientation of several different optical elements, the number of motors used can optionally be substantially independent of the number of optical elements in the array. This advantageously reduces the cost, complexity and weight of the array, thereby enabling tracking heliostat arrays to be used in small-scale applications and/or weight sensitive applications, such as individual rooftop mounted residential systems, as well as large-scale applications.

In one embodiment of the present invention, a tracking heliostat array comprises a plurality of optical elements. The tracking heliostat array further comprises a frame separated from the optical elements. Each of the optical elements has an orientation with respect to the frame. The tracking heliostat array further comprises a plurality of supports coupled to at least one of the optical elements. The tracking heliostat array further comprises a turnbuckle coupled to at least one of the supports and to the frame. Rotation of the turnbuckle causes the corresponding support to be displaced relative to the frame. The orientation of the optical element relative to the frame is adjustable. The tracking heliostat array further comprises a traveling actuator configured to rotate at least one of the turnbuckles. The tracking heliostat array further comprises a positioning mechanism supporting the traveling actuator. The positioning mechanism is configured to move the traveling actuator from a first selected turnbuckle to a second selected turnbuckle.

According to another embodiment of the present invention, a concentrator apparatus comprises a plurality of optical elements positionable to concentrate light. The concentrator apparatus further comprises a support structure separated from the optical elements. Each of the optical elements has an adjustable orientation with respect to the support structure. The concentrator apparatus further comprises a plurality of adjustment mechanisms. Actuation of a selected adjustment mechanism changes the orientation of an optical element corresponding to the selected adjustment mechanism. The concentrator apparatus further comprises a traveling actuator configured to sequentially actuate a plurality of the selected adjustment mechanisms.

According to another embodiment of the present invention, a method of concentrating solar radiation on a collector using a plurality of reflectors comprises moving a traveling actuator to a first selected one of the plurality of reflectors. The method further comprises rotating a first turnbuckle corresponding to the first selected reflector, thereby changing an orientation of the first selected reflector in a first plane. The method further comprises rotating a second turnbuckle corresponding to the first selected reflector, thereby changing an orientation of the first selected reflector in a second plane orthogonal to the first plane. The method further comprises moving the traveling actuator to a second selected one of the plurality of reflectors. The method further comprises rotating a third turnbuckle corresponding to the second selected reflector, thereby changing an orientation of the second selected reflector in the first plane. The method further comprises rotating a fourth turnbuckle corresponding to the second selected reflector, thereby changing an orientation of the second selected reflector in the second plane.

According to another embodiment of the present invention, a method of concentrating optical energy onto a collector comprises positioning a traveling actuator to engage a first optical element. The method further comprises moving the first optical element from a first orientation to a second orientation using the traveling actuator. The first optical element reflects more optical energy onto a collector when positioned in the second orientation as compared to the first orientation. The method further comprises positioning the traveling actuator to engage a second optical element. The method further comprises moving the second optical element from a first orientation to a second orientation using the traveling actuator. The second optical element reflects more optical energy onto the collector when positioned in the second orientation as compared to the first orientation.

According to another embodiment of the present invention, a concentrator system comprises a first optical element tiltable with respect to at least one axis via a first adjustment structure. The system further comprises a second optical element tiltable with respect to at least one axis via a second adjustment structure. The second optical element is tiltable independently of the first optical element. The system further comprises a traveling actuator configured to travel to engage the first adjustment structure to tilt the first optical element to a first desired orientation. The traveling actuator is further configured to travel to engage the second adjustment structure to tilt the second optical element to a second desired orientation.

BRIEF DESCRIPTION OF THE DRAWINGS

Exemplary embodiments of the improved tracking heliostat array are illustrated in the accompanying drawings, which are for illustrative purposes only. The drawings comprise the following figures, in which like numerals indicate like parts.

DETAILED DESCRIPTION OF PREFERRED EMBODIMENTS

As described herein, an improved heliostat or solar concentrator array having individually adjustable optical elements has been developed. By using a common set of motors to adjust the orientation of individual optical elements serially, sequentially, or in other desired order, fewer overall motors are required as compared to an array having dedicated motors associated with each optical element. Consequently, the improved tracking heliostat arrays disclosed herein can be less expensive, more reliable, and lighter than many conventional tracking heliostat arrays.

Heliostat arrays reflect solar energy from the sun or other light source onto a collector or receiver, where it is generally converted to another form of energy. The solar energy is reflected by "optical elements," which can include planar mirrors, concave mirrors, lenses, reflectors, other devices capable of reflecting or focusing light, and/or a combination of the foregoing. The optical elements are optionally enclosed within a clear cover, such as a plastic cover, to protect the array from environmental damage or dirt. As used herein, the "collector" refers generally to a device configured to receive solar energy reflected from the heliostat array and to convert the received solar energy to another form of energy.

Certain collectors, such as photovoltaic cells and Stirling engines combined with a generator, convert the received solar energy into electric energy, which can be in the form of a voltage potential with an associated available current. Other collectors convert the received solar energy into other forms of energy, such as thermal energy and/or mechanical energy. For example, a Stirling engine can be included in the collector. The Stirling engine converts thermal energy or a temperature differential, such as that resulting from focused solar energy, to movement. An example Stirling engine can include a displacer piston that moves enclosed air back and forth between cold and hot reservoirs. A regenerator, which can be in the form of a wire mesh or the displacer piston itself, is optionally positioned between the hot and cold reservoirs. In the hot reservoir the air expands and pushes a power piston, producing work and displacing the air to the cold reservoir. The air contracts in the cold reservoir, thereby "pulling" the power piston. If a regenerator is used, then as the air cycles between the hot and cold reservoirs, the heat is transferred to and from the regenerator. By way of further example, a frying pan can be used to convert solar energy received from a heliostat array into thermal energy, which can then be used to cook food that is placed in the frying pan.

Figure 1:
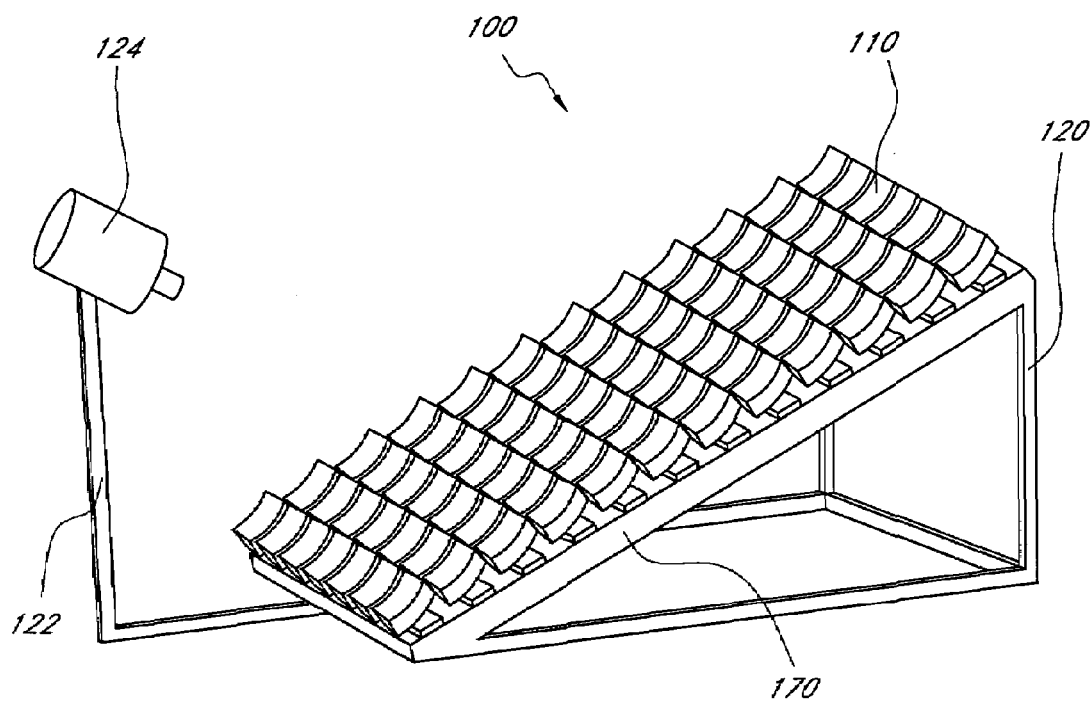
FIG. 1 is a perspective view of an exemplary tracking heliostat array having ninety-six reflectors.

An exemplary heliostat array is illustrated in FIG. 1. This heliostat array 100 includes a plurality of optical elements 110 which are mounted to an optional underlying support frame 120. The support frame 120 includes a mount 122 configured to support a collector 124 in a position to receive solar energy reflected from the optical elements 110. The mount 122 is optionally pivotable or otherwise moveable so as to position the collector 124 in a desired position. The heliostat array 100 can be mounted in a location that is exposed to sunlight, such as a rooftop or the ground, and the particular configuration of the example support frame 120 can be adjusted based on the mounting location. As illustrated in FIG. 1, the heliostat array 100 can be mounted in an inclined orientation so as to more directly face the sun, such as on an inclined south-facing rooftop. Optionally, the inclination angle can be varied by having the inclined portion pivot relative to the bottom of the frame 120, wherein the position can be locked via pins, bolts, clamps, and so on.

To increase the amount of solar energy reflected onto the collector, the orientation of the optical elements comprising the heliostat array can be adjusted. For example, certain heliostat arrays are configured to change the orientation of the optical elements over the course of a day or a year to increase the amount of solar energy reflected onto the collector. Heliostat arrays having adjustable optical elements are often referred to as "tracking" heliostat arrays. In certain conventional embodiments, one or more motors are fixedly coupled to each optical element in the array, thereby allowing the orientation of each element to be individually adjusted.

Figure 2:
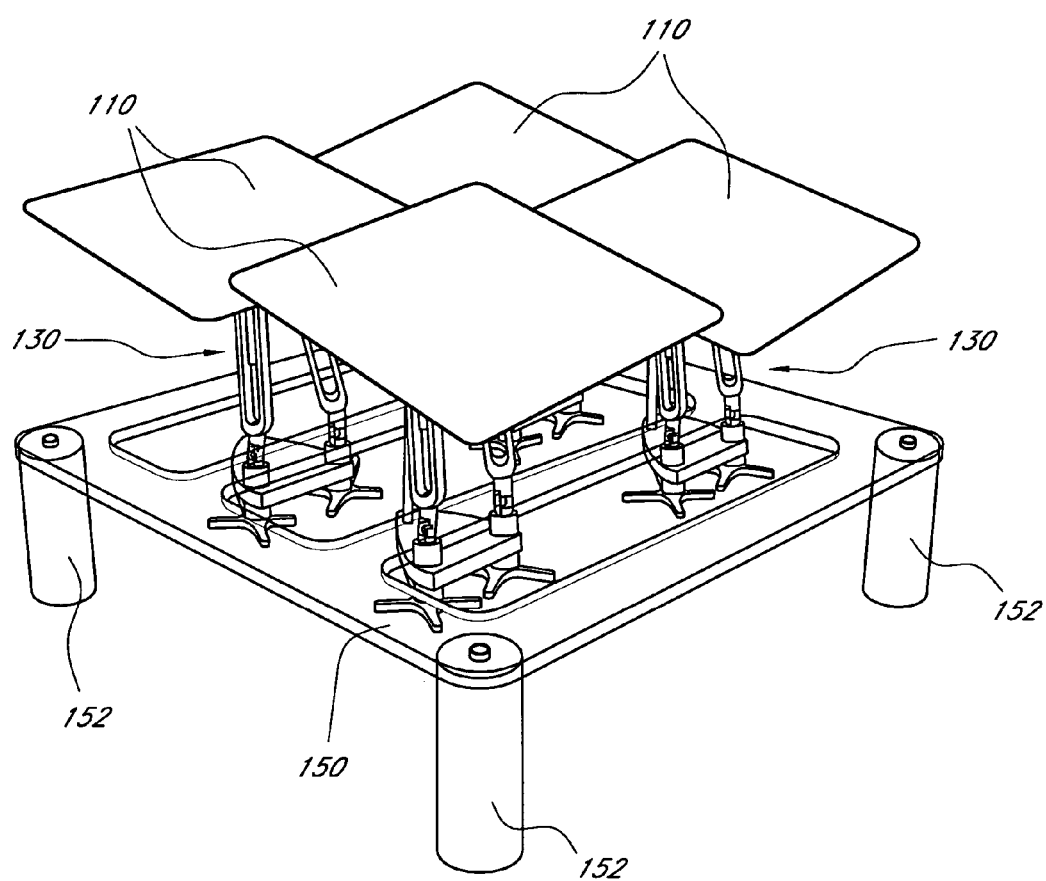
FIG. 2 is a perspective view of another exemplary tracking heliostat array having four reflectors.

An improved tracking heliostat array system has been developed. In this improved system, the optical elements are individually adjustable, but one or more motors are shared by the optical elements, and so dedicated motors for adjusting each optical element are not required. For example, one or more traveling actuators can be used to sequentially or separately adjust the orientation of individual optical elements comprising the array. FIG. 2 illustrates an exemplary 2×2 array of optical elements 110 that are individually adjustable using traveling actuators as described in greater detail herein. For clarity, the example system illustrated in FIG. 2 includes only four optical elements; the traveling actuator system disclosed herein can also be used with larger or smaller heliostat arrays, including arrays that are circular, linear, rectangular, or irregular in general shape.

Figure 3:
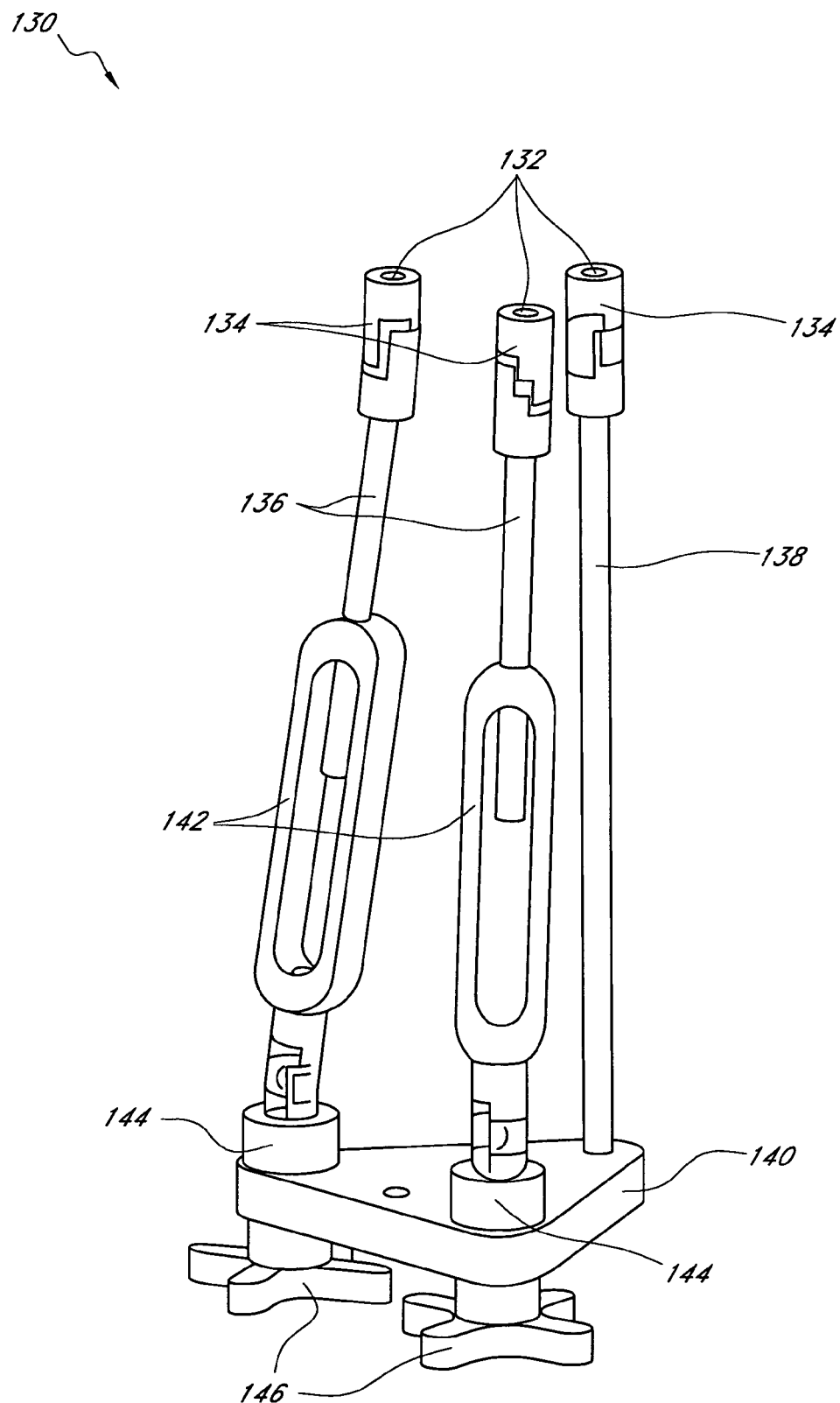
FIG. 3 is a perspective view of an exemplary adjustable reflector support mechanism.

Still referring to FIG. 2, the optical elements 110 are mounted or coupled to a plurality of support assemblies 130. An exemplary support assembly 130 is illustrated in FIG. 3. This exemplary support assembly 130 includes a plurality of element mounts 132. The element mounts 132 are configured to be secured to the optical element 110, such as with an adhesive, a hook-and-loop fastener, a screw, a bolt, a magnet, a snap, a pin, or other appropriate attachment mechanism.

Opposite the optical element 110, the element mounts 132 are attached to hinge 134. The hinge 134 allows the element mounts 132 to pivot with respect to adjustable rods 136 and fixed rod 138, as illustrated in FIG. 3. The fixed rod 138 is secured to support base 140. The adjustable rods 136 are threaded into turnbuckles 142, which include a link with screw threads at one end or both ends thereof. The turnbuckles 142 are configured such that rotation of the turnbuckle 142 causes the adjustable rods 136 to be threaded through the turnbuckle threads, thereby causing the corresponding element mounts 132 to be raised (extended) or lowered (retracted) relative to the support base 140 to thereby orient the optical element 110 by pivotably pushing or pulling the corresponding optical element. The turnbuckles 142 are mounted to pivotable hinges 144, which are connected through the support base 140 to gear 146. In one embodiment, the gear 146 is a four-pronged or toothed pinwheel, although the gear 146 can include greater or fewer teeth.

Thus, rotating the gear 146 causes the corresponding pivotable hinge 144 and turnbuckle 142 to rotate. This causes the corresponding adjustable rod 136 to be threaded through the turnbuckle 142, and thereby causes the corresponding element mount 132 to move up or down relative to the support base 140, depending on the direction that the gear 146 is rotated. Other embodiments can use other types of support and/or positioning assemblies. For example, pneumatic or magnetic support and/or positioning assemblies can be used.

Thus, the exemplary support assembly 130 illustrated in FIG. 3 allows the orientation of the optical elements 110 mounted thereto to be adjusted by rotating the gears 146. As the optical element 110 is reoriented, the hinge 134 moves to accommodate the optical element with respect to the fixed rod 138. While the exemplary embodiment illustrated in FIG. 3 includes two adjustable rods 136 and one fixed rod 138, other embodiments include other combinations of fixed and adjustable rods, depending on the number of degrees of freedom the optical element 110 is to have. For example, in other embodiments the support assembly 130 includes one adjustable rod and one fixed rod, one adjustable rod and two fixed rods or three adjustable rods. Other combinations can be used in other embodiments, including combinations with more than three total rods.

Referring again to FIG. 2, in an exemplary embodiment the support assemblies 130 are mounted to mounting bracket 150. Optionally, the support assemblies 130 are removably mounted to the mounting bracket 150, thereby allowing their position on the mounting bracket 150 to be adjustable, and also allowing individual support assemblies 130 to be independently removed if repair or replacement becomes necessary. Additionally, in other embodiments, more or fewer than four support assemblies can be mounted to the mounting bracket; for example, in one embodiment an 8×12 array of support assemblies are mounted to the mounting bracket. The mounting bracket optionally includes feet 152 (illustrated in FIG. 2) which can be used to secure the mounting bracket to the support frame 120 (illustrated in FIG. 1).

The foregoing describes a tracking heliostat array having a plurality of optical elements 110 mounted to a support frame 120. The orientation of a selected optical element 110 can be adjusted by turning one or more gears 146 associated with the selected optical element 110.

Figure 4:
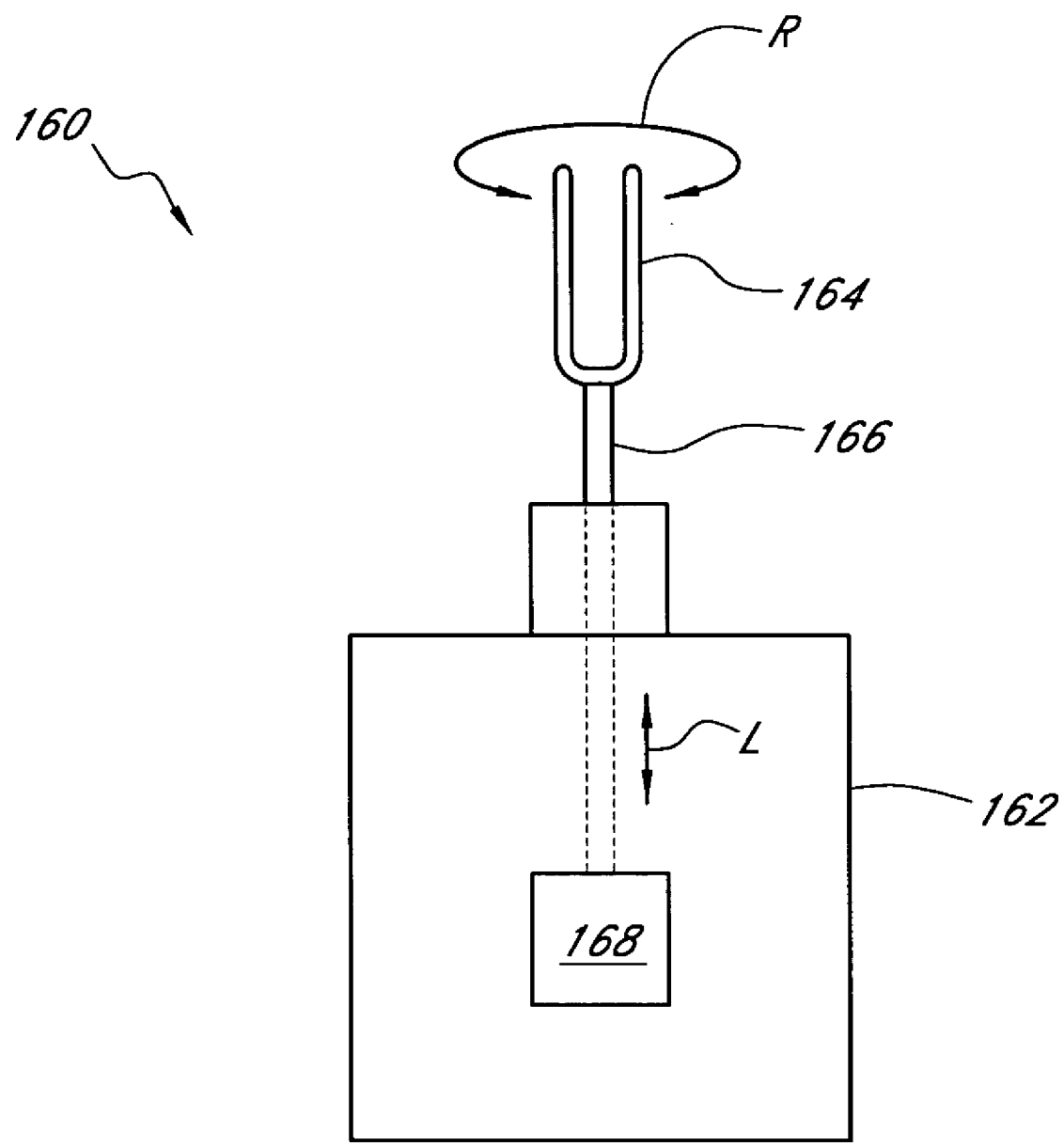
FIG. 4 is a schematic illustration of an exemplary traveling actuator.

In an exemplary embodiment of the tracking heliostat array disclosed herein, a traveling actuator is used to engage and rotate the gears 146 of the support assemblies 130 or otherwise cause the optical element to be moved or rotated to the desired orientation. An exemplary embodiment of the traveling actuator 160 is illustrated in FIG. 4. The traveling actuator 160 comprises a base 162 which houses a motor 168, such as a small electric AC or DC motor. The traveling actuator further comprises a drive gear 164 coupled to a motor drive shaft 166. In such embodiments, the motor is configured to separately move the motor drive shaft 166 in two dimensions. First, the motor is configured to move the motor drive shaft 166 linearly, as indicated by arrows L in FIG. 4. This motion can be used to engage and disengage the drive gear 164 with one of the support assembly gears 146 described herein. Second, the motor is configured to rotate the motor drive shaft 166, as indicated by arrows R in FIG. 4. Once the drive gear 164 is engaged with one of the support assembly gears 146, the rotational motion can be used to rotate the support assembly gear 146.

Therefore, the traveling actuator 160 can be used to rotate one of the support assembly gears 146. In a modified embodiment, the traveling actuator 160 can be configured to engage and disengage the support assembly using an electromagnet to rotate the turnbuckle adjustable rods 136. In such embodiments, the traveling actuator motor can optionally be configured to move the motor drive shaft 166 only rotationally, thereby simplifying the design even further. In other modified embodiments, the traveling actuator 160 can be configured to rotate the pivotable hinges 144 and turnbuckles 142 using a screw-screwdriver arrangement, a plug-receptacle arrangement, a key-key receptacle arrangement, or other appropriate arrangements.

Figure 5:
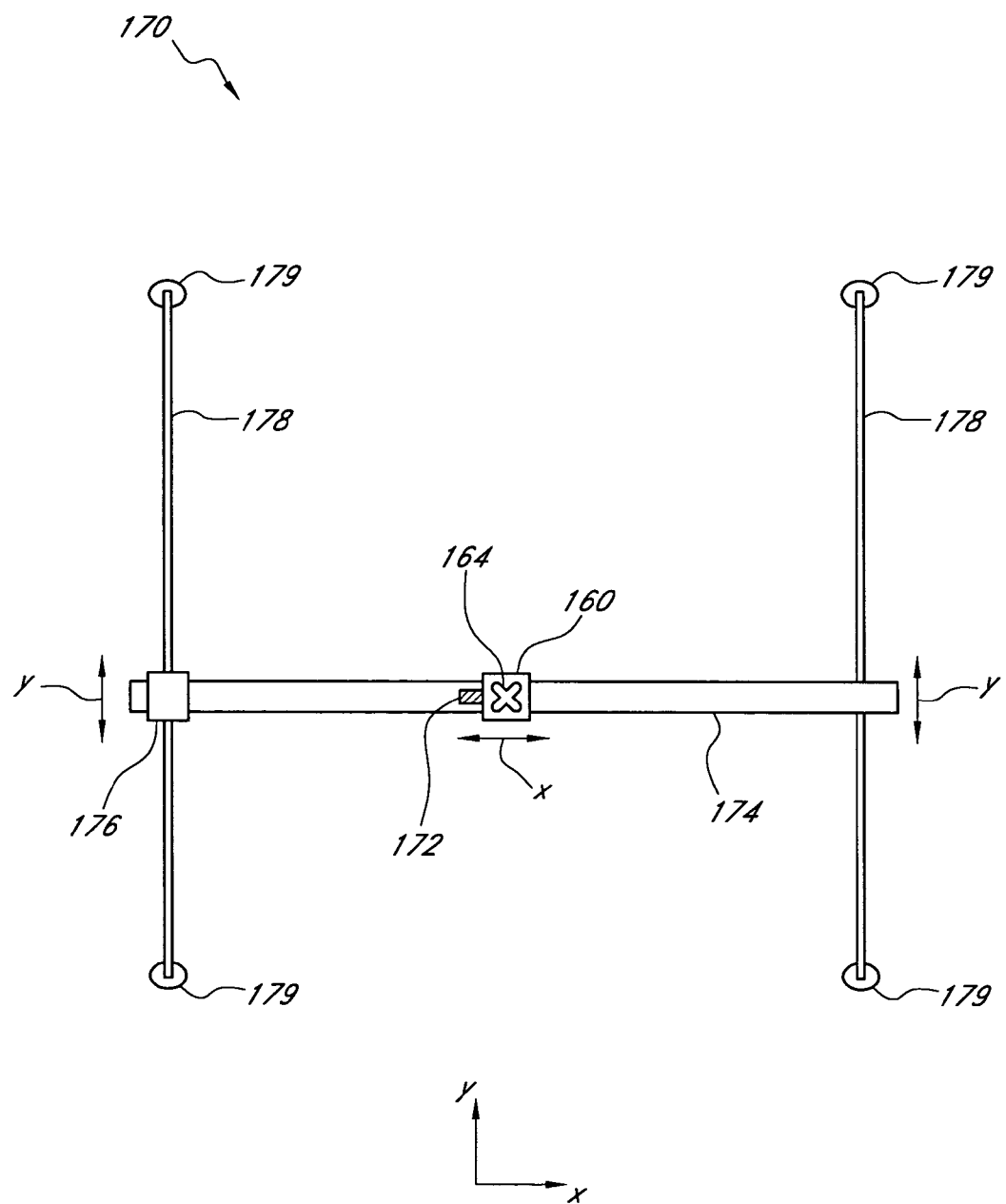
FIG. 5 is a schematic illustration of an exemplary mechanism for supporting a traveling actuator under a rectangular heliostat array.

In the illustrated example, the traveling actuator 160 can actuate the gears 146 of the plurality of support assemblies 130 in the heliostat array. To position the traveling actuator 160 adjacent to the gear 146 to be actuated, the traveling actuator 160 is mounted on a positioning stage 170, an exemplary embodiment of which is illustrated in FIG. 5. The positioning stage 170 is optionally mounted substantially parallel to a plane defined by the array of optical elements or the support frame 120. The positioning stage 170 is configured to allow the traveling actuator 160 to be positioned adjacent to the gear 146 to be rotated. In an exemplary embodiment, the positioning stage 170 includes a first motor 172 configured to move the traveling actuator 160 along a first linear track 174, and a second motor 176 configured to move the first linear track 174 along at least one second linear track 178. In this exemplary embodiment, the first motor 172 moves the traveling actuator 160 in the ±x direction, and the second motor 176 moves the traveling actuator 160 in the ±y direction.

In an exemplary embodiment, the positioning stage 170 illustrated in FIG. 5 is mounted to the support frame 120 using mounting hardware 179. Placing the positioning stage 170 opposite the mounting bracket 150 from the optical elements 110 allows the traveling actuator to engage the support assembly gears 146, as described herein. This configuration advantageously allows the traveling actuator 160 to reach the gears 146 associated with the support assemblies 130 that comprise the heliostat array.

In this exemplary configuration, the number of motors required to move and actuate the traveling actuator 160 is substantially independent of the number of optical elements in the heliostat array. For example, the same number of motors used to adjust the optical elements in the 2×2 heliostat array illustrated in FIG. 2 can be used to adjust the optical elements in the 8×12 heliostat array illustrated in FIG. 1. This should be distinguished from many conventional tracking heliostat arrays, wherein the number of motors required to adjust the optical elements varies in direct proportion with the number of optical elements present in the array.

Figure 6:
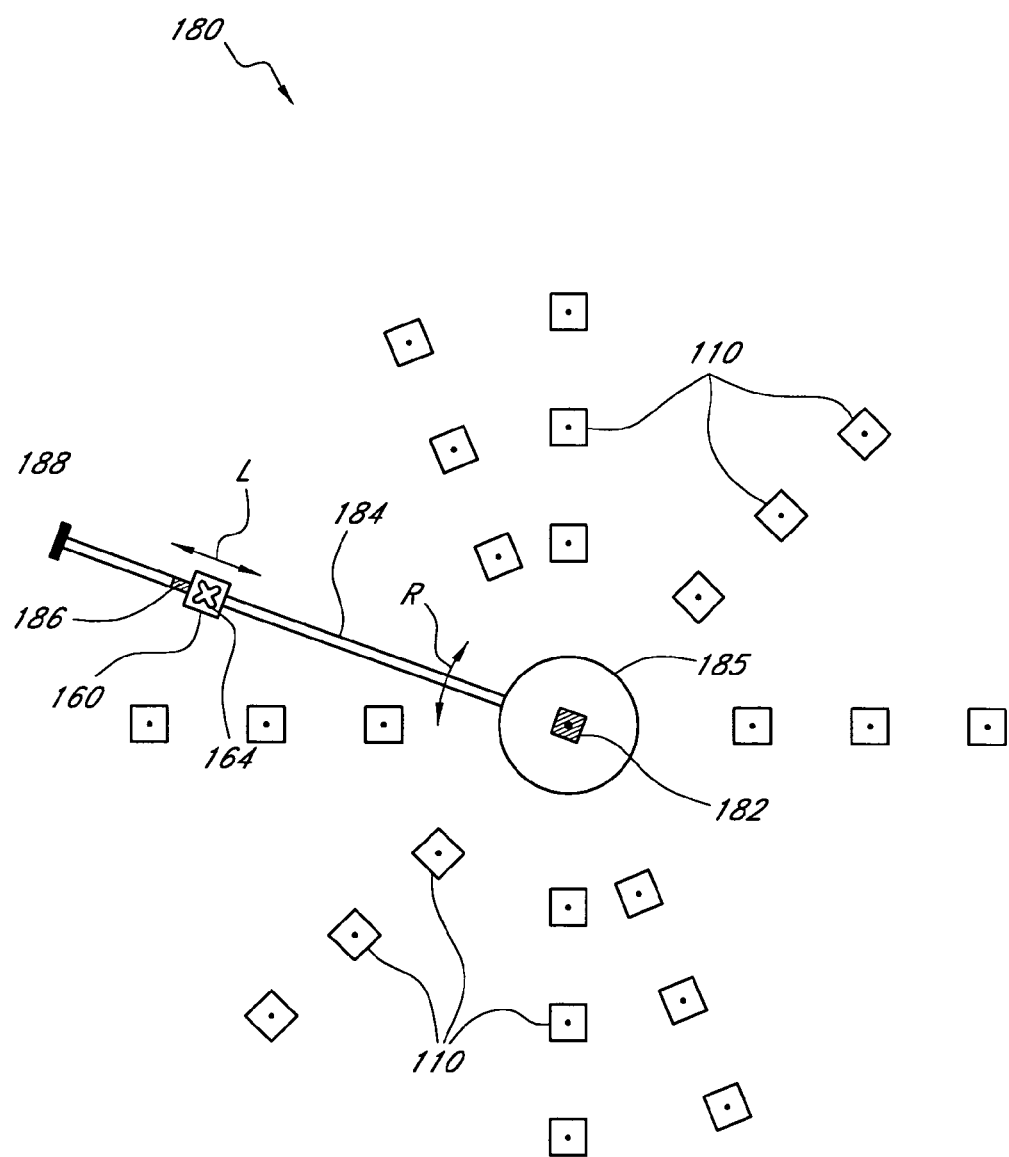
FIG. 6 is a schematic illustration of an exemplary mechanism for supporting a traveling actuator under a circular heliostat array.

Although FIG. 5 illustrates that the positioning stage 170 can be configured to move the traveling actuator 160 to a particular location using orthogonal linear movements, other configurations can be implemented in other embodiments. For example, FIG. 6 illustrates a radial positioning stage 180 configured to move the traveling actuator 160 to a particular location using angular and radial movements. This configuration is particularly useful when the optical elements 110 are arrayed in a circular arrangement.

In the exemplary embodiment illustrated in FIG. 6, a first motor 182 is configured to rotate arm 184 around a central housing 185. A second motor 186 is configured to move the traveling actuator 160 linearly along the arm 184. That is, the first motor 182 provides rotational movement R, whereas the second motor 186 provides linear movement L. The arm 184 is optionally supported by supplementary support 188, which is a wheel in an exemplary embodiment. In such a configuration, the central housing 185 optionally provides a mounting location for the collector 124 (not shown).

In a modified embodiment, more than one traveling actuator is used to adjust the optical elements. For example, in the rotary embodiment illustrated in FIG. 6, the first motor 172 can be configured to drive additional arms supporting additional traveling actuators. Or, the arm 184 can be configured to support more than one traveling actuator. As another example, in the linear embodiment illustrated in FIG. 5, the second linear track 178 can be configured to support additional first linear tracks supporting additional traveling actuators. Or, the first linear track 174 can be configured to support more than one traveling actuator.

Figure 7A:
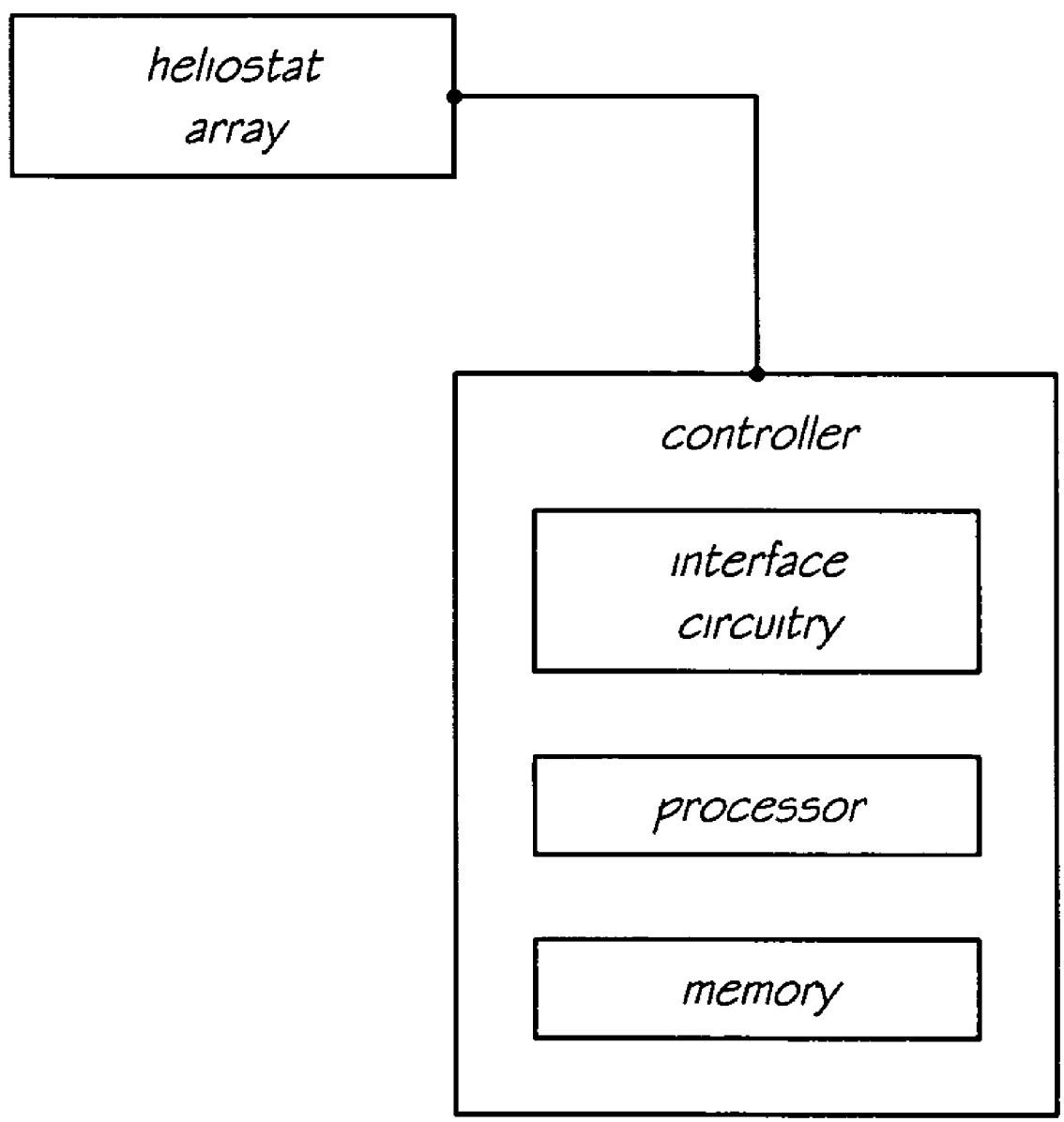
FIG. 7A is a schematic illustration of an exemplary system for controlling a tracking heliostat array.

The traveling actuators can be controlled and positioned by a controller, which can include a state machine, an embedded processor executing program instructions, and/or a general purpose computer executing program instructions. A schematic illustration of an exemplary control system is provided in FIG. 7A. The controller can be coupled to the traveling actuators via a motor interface circuit. The controller can further include position information, such as x-y location information or angle and radial information, for the support mechanisms. Using this position information, the controller will move the traveling actuators to accordingly engage the support mechanisms. In addition or alternatively, the traveling actuators can include sensors, such as optical, radiofrequency, or magnetic sensors that sense a corresponding bar code, radiofrequency identifier tag, or magnetic strip. Using the sensor information, the controller can move the traveling actuators to accordingly engage the support mechanisms.

The tracking heliostat arrays disclosed herein optionally include a feedback mechanism to adjust the orientation of the optical elements in a way that increases the amount of solar energy reflected to the collector. Because the sun moves slowly, a single traveling actuator can be used in a low duty cycle fashion to serially adjust a large number of optical elements.

Figure 7B:
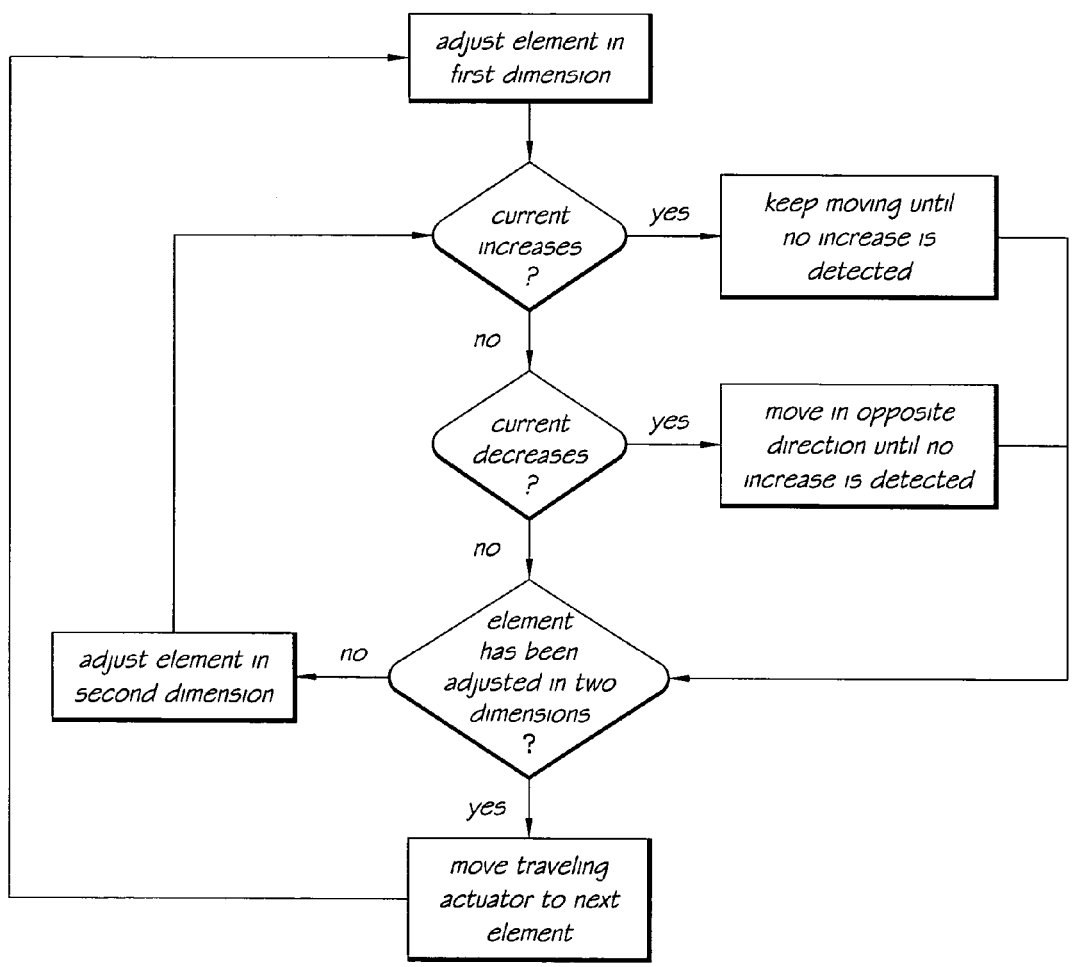
FIG. 7B is a flowchart illustrating an exemplary method of operating a feedback system with a tracking heliostat array.

For example, in one exemplary method, illustrated in the flowchart of FIG. 7B, a sensor is configured to monitor the amount of electrical current generated by a photovoltaic cell in the collector. The traveling actuator is then moved by the controller to a selected optical element, and adjusts the orientation of the selected optical element in a first dimension. If the amount of current generated by the photovoltaic cell increases in response to the adjustment, the optical element is further adjusted in the same direction until a decrease is detected. If the amount of current generated by the photovoltaic cell decreases in response to the adjustment, the optical element is adjusted in the opposite direction, which should result in a current increase. The adjustment is then continued until a decrease is detected. The traveling actuator can then repeat the process for the same optical element in a second dimension, after which the process is repeated for another element in the array. This technique can be modified for other embodiments wherein the optical elements have other than two degrees of freedom.

More complex orientation algorithms can optionally be used in other embodiments. For example, the tracking heliostat array optionally includes control circuitry capable of calculating the sun's position based on the date and time, and orienting the optical elements accordingly based on the location where the array is deployed. As another example, the tracking heliostat array optionally includes control circuitry having instructions with respect to which order the optical elements should be adjusted in. For example, in one embodiment, the optical elements around the perimeter are reoriented less frequently than the optical elements in the center of the array.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than tracking heliostat arrays.

We claim:
1. A tracking heliostat array comprising:
   a plurality of optical elements;
   a frame separated from the optical elements, wherein each of the optical elements has an orientation with respect to the frame;
   a plurality of supports coupled to at least one of the optical elements;
   a turnbuckle coupled to at least one of the supports and to the frame, wherein rotation of the turnbuckle causes the corresponding support to be displaced relative to the frame, such that the orientation of the optical element relative to the frame is adjustable;
   a traveling actuator configured to rotate at least one of the turnbuckles; and
   a positioning mechanism supporting the traveling actuator, wherein the positioning mechanism is configured to move the traveling actuator from a first selected turnbuckle to a second selected turnbuckle.

2. The tracking heliostat array of claim 1, wherein the plurality of supports includes prongs.

3. The tracking heliostat array of claim 1, wherein at least one of the turnbuckles includes a gear configured to engage the traveling actuator.

4. The tracking heliostat array of claim 1, wherein the traveling actuator includes a key, and wherein at least one of the turnbuckles includes an engagement mechanism configured to receive the key, such that engaging the key with the engagement mechanism and rotating the key causes the at least one turnbuckle to rotate.

5. The tracking heliostat array of claim 1, wherein the traveling actuator includes a key, and wherein at least one of the turnbuckles includes an engagement mechanism configured to receive the key, such that engaging the key with the engagement mechanism and rotating the key causes the at least one turnbuckle to rotate, and wherein the engagement mechanism comprises a four-pronged wheel.

6. The tracking heliostat array of claim 1, wherein the traveling actuator includes a key, and wherein at least one of the turnbuckles includes an engagement mechanism configured to receive the key, such that engaging the key with the engagement mechanism and rotating the key causes the at least one turnbuckle to rotate; and further comprising an auxiliary motor to engage the key with the engagement mechanism.

7. The tracking heliostat array of claim 1, wherein a substantially transparent cover overlays at least one of the optical elements.

8. The tracking heliostat array of claim 1, further comprising control circuitry configured to operate the traveling actuator to increase a quantity of solar energy reflected from at least one of the optical elements to a collector.

9. The tracking heliostat array of claim 1, further comprising control circuitry configured to operate the traveling actuator to increase a quantity of solar energy reflected from at least one of the optical elements to a solar cell.

10. The tracking heliostat array of claim 1, wherein at least one of the optical elements has three degrees of freedom.

11. The tracking heliostat array of claim 1, further comprising an auxiliary traveling actuator configured to rotate at least one of the turnbuckles.

12. The tracking heliostat array of claim 1, wherein at least one of the optical elements is a mirror.

13. The tracking heliostat array of claim 1, wherein at least one of the optical elements is a planar mirror.

14. The tracking heliostat array of claim 1, wherein at least one of the optical elements is a reflector.

15. The tracking heliostat array of claim 1, wherein at least one of the optical elements is a concave reflector.

16. The tracking heliostat array of claim 1, further comprising a collector positioned to receive solar energy reflected from at least one of the optical elements.

17. The tracking heliostat array of claim 1, further comprising a collector positioned to receive solar energy reflected from at least one of the optical elements, wherein the collector is movable with respect to the optical elements.

18. The tracking heliostat array of claim 1, further comprising a fixed support prong coupling at least one of the optical elements to the support frame.

19. A concentrator apparatus comprising:
a plurality of optical elements positionable to concentrate light;
a support structure, wherein each of the optical elements has an adjustable orientation with respect to the support structure;
a plurality of adjustment mechanisms, such that actuation of a selected adjustment mechanism changes the orientation of an optical element corresponding to the selected adjustment mechanism; and
a traveling actuator configured to sequentially actuate a plurality of the selected adjustment mechanisms.

20. The concentrator apparatus of claim 19, wherein two adjustment mechanisms are associated with one of the optical elements.

21. The concentrator apparatus of claim 19, further comprising a controller that controls positioning of the traveling actuator with respect to the plurality of optical elements.

22. The concentrator apparatus of claim 19, further comprising computer readable memory that stores the location of the plurality of optical elements.

23. The concentrator apparatus of claim 19, wherein the support structure is at an incline.

24. The concentrator apparatus of claim 19, wherein a single adjustment mechanism is associated with one of the optical elements.

25. The concentrator apparatus of claim 19, wherein the adjustment mechanism includes a rod coupled to a first of the optical elements, wherein the rod is configured to selective push and pull the first optical elements.

26. The concentrator apparatus of claim 19, wherein the adjustment mechanism comprises a turnbuckle having a first end coupled to the support structure and a second end coupled to one of the optical elements, wherein the turnbuckle first end is rotatable with respect to the turnbuckle second end.

27. The concentrator apparatus of claim 19, wherein the traveling actuator includes a key, and wherein at least one of the adjustment mechanisms includes an engagement mechanism configured to receive the key, such that engaging the key with the engagement mechanism and rotating the key actuates the at least one adjustment mechanism.

28. The concentrator apparatus of claim 19, wherein at least one of the optical elements is a planar mirror.

29. The concentrator apparatus of claim 19, wherein the plurality of optical elements are arranged in a rectangular array having a plurality of rows and columns.

30. The concentrator apparatus of claim 19, wherein the plurality of optical elements are arranged in a circular array.

31. A method of concentrating solar radiation on a collector using a plurality of reflectors, the method comprising:
moving a traveling actuator to a first selected one of the plurality of reflectors;
rotating a first turnbuckle corresponding to the first selected reflector, thereby changing an orientation of the first selected reflector in a first plane;
rotating a second turnbuckle corresponding to the first selected reflector, thereby changing an orientation of the first selected reflector in a second plane orthogonal to the first plane;
moving the traveling actuator to a second selected one of the plurality of reflectors;
rotating a third turnbuckle corresponding to the second selected reflector, thereby changing an orientation of the second selected reflector in the first plane; and
rotating a fourth turnbuckle corresponding to the second selected reflector, thereby changing an orientation of the second selected reflector in the second plane.

32. The method of claim 31, further comprising:
measuring a quantity of solar energy reflected from the plurality of reflectors to a collector; and
adjusting the rotation of the first, second, third and fourth turnbuckles to increase the measured quantity of solar energy.

33. The method of claim 31, wherein at least one of the reflectors is a planar mirror.

34. The method of claim 31, wherein at least one of the reflectors is a concave reflector.

35. The method of claim 31, wherein moving the traveling actuator to the second selected one of the plurality of reflectors comprises moving the traveling actuator in a first linear direction and moving the traveling actuator in a second linear direction perpendicular the first linear direction.

36. The method of claim 31, wherein moving the traveling actuator to the second selected one of the plurality of reflectors comprises simultaneously moving the traveling actuator in a first linear direction and in a second linear direction perpendicular the first linear direction.

37. The method of claim 31, wherein moving the traveling actuator to the second selected one of the plurality of reflectors comprises moving the traveling actuator in an angular direction and in a radial direction.

38. A method of concentrating optical energy onto a collector, the method comprising:
positioning a traveling actuator to engage a first optical element;
moving the first optical element from a first orientation to a second orientation using the traveling actuator, wherein the first optical element reflects more optical energy onto a collector when positioned in the second orientation as compared to the first orientation;
positioning the traveling actuator to engage a second optical element; and
moving the second optical element from a first orientation to a second orientation using the traveling actuator, wherein the second optical element reflects more optical energy onto the collector when positioned in the second orientation as compared to the first orientation.

39. The method of claim 38, wherein the traveling actuator engages at least one of the first and second optical elements using a magnet.

40. The method of claim 38, wherein at least one of the optical elements is a planar mirror.

41. The method of claim 38, wherein at least one of the optical elements includes a lens.

42. The method of claim 38, wherein moving the first optical element from the first orientation to the second orientation comprises rotating a turnbuckle that is coupled to the first optical element and a support frame underlying the plurality of optical elements.

43. The method of claim 38, wherein at least one of the optical elements has three degrees of freedom.

44. The method of claim 38, wherein at least one of the optical elements has two degrees of freedom.

45. The method of claim 38, wherein the collector is a solar cell.

46. The method of claim 38, wherein the collector is a Stirling engine.

47. A concentrator system comprising:
a first optical element tiltable with respect to at least one axis via a first adjustment structure;
a second optical element tiltable with respect to at least one axis via a second adjustment structure, wherein the second optical element is tiltable independently of the first optical element; and
a traveling actuator configured to travel to engage the first adjustment structure to tilt the first optical element to a first desired orientation, and to travel to engage the second adjustment structure to tilt the second optical element to a second desired orientation.

48. The concentrator system as defined in claim 47, wherein the first optical element is a reflector.

49. The concentrator system as defined in claim 47, further comprising a solar cell, wherein the first optical element and the second optical element are tiltable to concentrate sunlight on the solar cell.

50. The concentrator system as defined in claim 47, further comprising a receiver, wherein the first optical element and the second optical element are tiltable to concentrate sunlight on the receiver.

51. The concentrator system as defined in claim 47, wherein the first adjustment structure includes a receiving portion configured to receive a portion of the traveling actuator.

52. The concentrator system as defined in claim 47, wherein the first adjustment structure includes a gear configured to engage the traveling actuator.

53. The concentrator system as defined in claim 47, wherein the first adjustment structure includes a screw mechanism rotatable by the traveling actuator.

54. The concentrator system as defined in claim 47, wherein the first optical element is positioned on a first side of a receiver and the second optical element is position on an opposite side of the receiver.

55. The concentrator system as defined in claim 47, wherein the first actuator includes a first motor that moves the traveling actuator along a first axis and a second motor that move the actuator along a second axis.

56. The concentrator system as defined in claim 47, wherein the first actuator includes a first motor configured to move the traveling actuator along a first axis and a second motor configured to separately engage the first and second adjustment mechanism.

57. The concentrator system as defined in claim 47, further comprising control circuitry configured to operate the traveling actuator to increase a quantity of solar energy reflected from at least one of the optical elements to a receiver.

58. The concentrator system as defined in claim 47, further comprising computer readable memory configured to store position information corresponding to the first and second adjustment structures.

59. The concentrator system as defined in claim 47, further comprising a sensor configured to locate the first and second adjustment structures.

* * * * *